(12) United States Patent
Boulin et al.

(10) Patent No.: US 7,566,953 B2
(45) Date of Patent: Jul. 28, 2009

(54) LEADFRAME DESIGNS FOR PLASTIC OVERMOLD PACKAGES

(75) Inventors: David M. Boulin, Lebanon, NJ (US); Hugo F. Safar, Westfield, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/079,124

(22) Filed: Mar. 25, 2008

(65) Prior Publication Data

US 2008/0173989 A1   Jul. 24, 2008

Related U.S. Application Data

(63) Continuation of application No. 11/455,969, filed on Jun. 20, 2006, now abandoned, which is a continuation of application No. 10/939,763, filed on Sep. 13, 2004, now abandoned.

(51) Int. Cl.
    *H01L 23/495* (2006.01)
(52) U.S. Cl. .................. 257/667; 257/E23.05
(58) Field of Classification Search ............. 257/667, 257/E23.05
    See application file for complete search history.

(56) References Cited

U.S. PATENT DOCUMENTS

| 5,589,402 | A  | * | 12/1996 | Ramsey et al. ......... 438/64 |
| 6,303,981 | B1 | * | 10/2001 | Moden ............... 257/666 |
| 2003/0001244 | A1 | * | 1/2003 | Araki et al. .......... 257/666 |
| 2004/0104457 | A1 | * | 6/2004 | Tan et al. ............ 257/666 |
| 2005/0051876 | A1 | * | 3/2005 | Manalac et al. ....... 257/666 |

* cited by examiner

*Primary Examiner*—Lex Malsawma
(74) *Attorney, Agent, or Firm*—Mendelsohn, Drucker & Associates, P.C.; Edward J. Meisarosh; Steve Mendelsohn

(57) ABSTRACT

The specification describes a plastic overmolded package for high power devices that has a very low lead count, typically fewer than eight, and in a preferred embodiment, only two. The leads occupy essentially the same linear space as the multiple leads in a conventional package and thus have a wide-blade configuration. To improve mechanical integrity, the leads in the package are provided with retention slots to add back the equivalent of the plastic joints in the spaces that were eliminated due to the wide-blade design. The retention slots extend in the width dimension of the leads.

10 Claims, 6 Drawing Sheets

LEADFRAME DESIGNS FOR PLASTIC OVERMOLD PACKAGES

RELATED APPLICATIONS

This application is a continuation of application Ser. No. 11/455,969 filed Jun. 20, 2006 now abandoned, which is a continuation of application Ser. No. 10/939,763, filed Sep. 13, 2004 now abandoned.

FIELD OF THE INVENTION

This invention relates to leadframe designs used in plastic overmolded packages for integrated circuit (IC) and related devices.

BACKGROUND OF THE INVENTION

The most common form of packaging for electronic devices such as IC devices is a plastic housing. Typically, the electronic components are assembled on a metal leadframe and a polymer is molded over the assembly to encapsulate the device. The leadframe serves not only to support the electronic components, but has metal tabs that extend from the overmolded plastic and provide a means to electrically connect to the encapsulated electronic components.

The leadframe, prior to assembly and encapsulation, typically is square or rectangular and has a center paddle to which a semiconductor chip is die bonded. The leads that provide electrical interconnection extend from the sides of the paddle, usually along two opposing edges of the leadframe, as in the common dual-in-line package (DIP). In high pin-count packages, such as quad flat packs, leads may extend from all four sides.

In plastic overmolded packages with many leads per side, the plastic flows around the leads and forms a very integral structure. A leadframe with 10 leads per side for example provides 9 spaces where the plastic joinswever, If the same space is occupied by only three leads for example, only two spaces where the plastic joins are provided. Thus as the number of leads are reduced, the mechanical integrity of the package may become an issue.

BRIEF STATEMENT OF THE INVENTION

We have designed a plastic overmolded package for high power devices that has a very low lead count, typically fewer than eight, and in a preferred embodiment, only two. The leads occupy essentially the same linear space as the multiple leads in a conventional package and thus have a wide-blade configuration. To improve mechanical integrity, the leads in the package are provided with retention slots to add back the equivalent of the plastic joints in the spaces that were eliminated due to the wide-blade design. The retention slots extend in the width dimension of the leads.

BRIEF DESCRIPTION OF THE DRAWING

The invention may be better understood when considered in conjunction with the drawing in which.

DETAILED DESCRIPTION OF THE INVENTION

Figure 1:
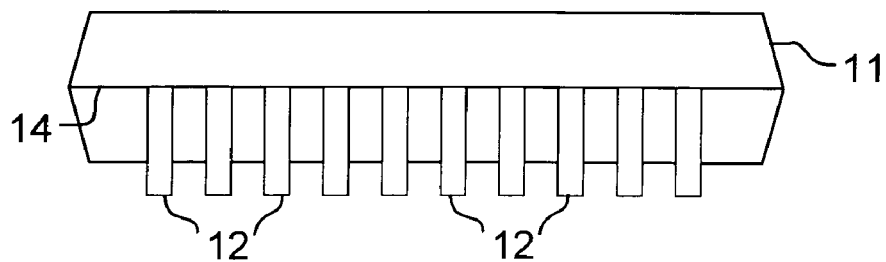
FIG. 1 is a side view of a conventional twenty lead plastic overmolded package.
Figure 2:
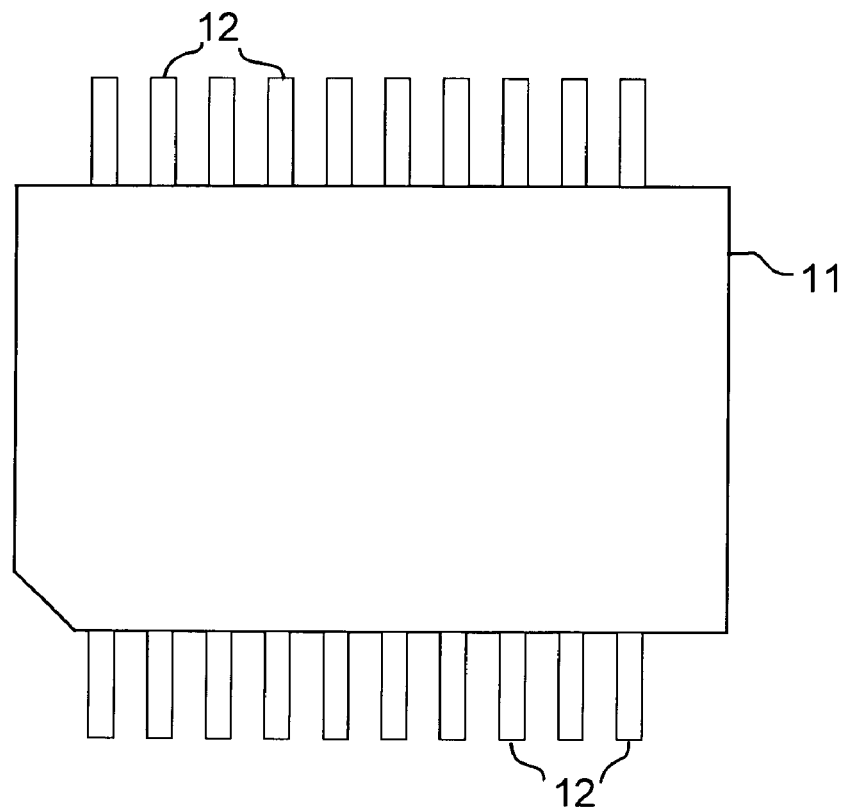
FIG. 2 is a plan view of the package of FIG. 1.

FIG. 1 shows a conventional twenty lead plastic overmolded package. This figure is nearly a scale representation of the MO-166 standard format approved by JEDEC. It should be understood at the outset that the MO-166 packaging format is represented here by way of example only. A wide variety of plastic overmolded package designs are available in the packaging industry. Many will share the properties described below. All plastic overmolded package products that have the features to be described are intended to be included in the scope of the invention. Referring again to FIG. 1, the plastic overmolded package body is shown at 11 and the twenty leads, ten to a side, are indicated at 12. In the embodiment shown, the leads are bent downward in a so-called gull-wing shape to allow for convenient surface mounting. This is the most familiar JEDEC MO-166 plastic overmolded package profile. For a better understanding, the plastic overmolded package of FIG. 1 is shown in FIG. 2 in plan view. This type of package is typically installed, in the final assembly, on a printed wiring board, or equivalent, and the plastic overmolded package is attached to the printed wiring board using surface mount assembly techniques. In a surface mount arrangement there usually are not significant forces that pull the leads (laterally) away from the plastic overmolded body. This aspect of the mounting arrangement may be recalled in the discussion below, which contrasts a failure mode of the packages with the modified design of the invention with conventional multiple lead packages.

Figure 3:
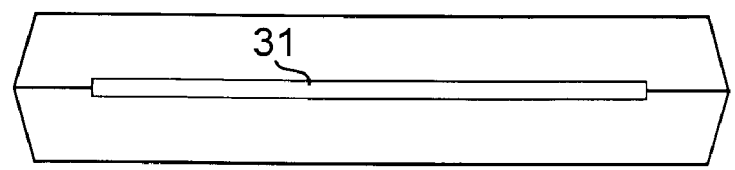
FIG. 3 is a side view of a twin lead plastic overmolded package.
Figure 4:
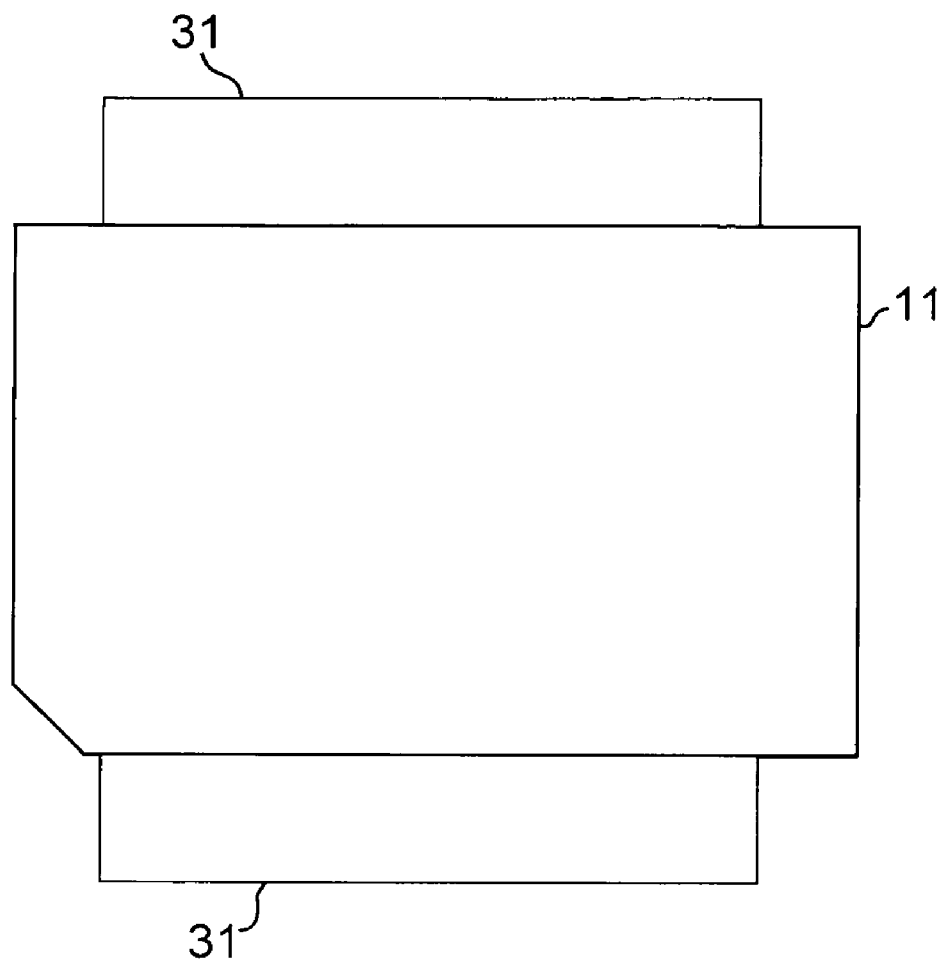
FIG. 4 is a plan view of a the plastic overmolded package of FIG. 3.

Plastic overmolded packages of the kind just described are used to encapsulate a variety of devices. We have modified the conventional package in significant ways to accommodate a high power diode. The particular power device for which the plastic overmolded package design has been modified has, in an electrical sense, two leads. The simplest embodiment is a plastic overmolded package wherein the leads in the standard MO-166 configuration have been merged to a single lead per side, thus producing a twin lead plastic overmolded package. This design is shown in FIG. 3, where the single lead per side is shown at 31. In the particular plastic overmolded package design of FIG. 3, the leads are so-called bayonet leads. They are tab-like in form, and are not bent for mounting. A plan view for this embodiment is shown in FIG. 4. A consequence of this design, where tab-like leads are used, is that lateral forces that tend to pull the tab away from the plastic overmold, or bend the tab thus distorting the package, are not uncommon. This is described in more detail below.

Figure 5:
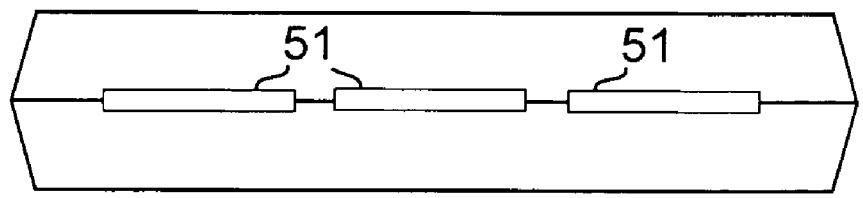
FIG. 5 is a side view of a modified plastic overmolded package having six leads, with three shown.
Figure 6:
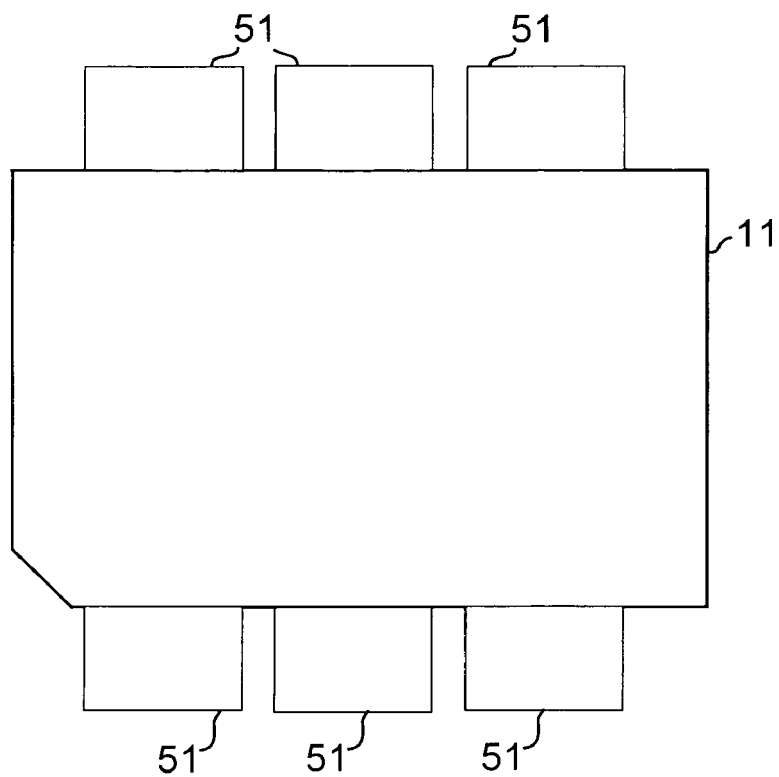
FIG. 6 is a plan view of the six lead plastic overmolded package of FIG. 5.

Although the power diode described here requires only two electrical interconnections, it is not unusual for a single electrical lead to be split. Accordingly, the single lead per side shown in FIGS. 3 and 4 may be split into two or more sections. For example, the embodiment of FIG. 5 shows the single lead (per side) of the plastic overmolded package of FIGS. 3 and 4 split to three leads 51 per side. This plastic overmolded package design is shown in plan view in FIG. 6.

Figure 7:
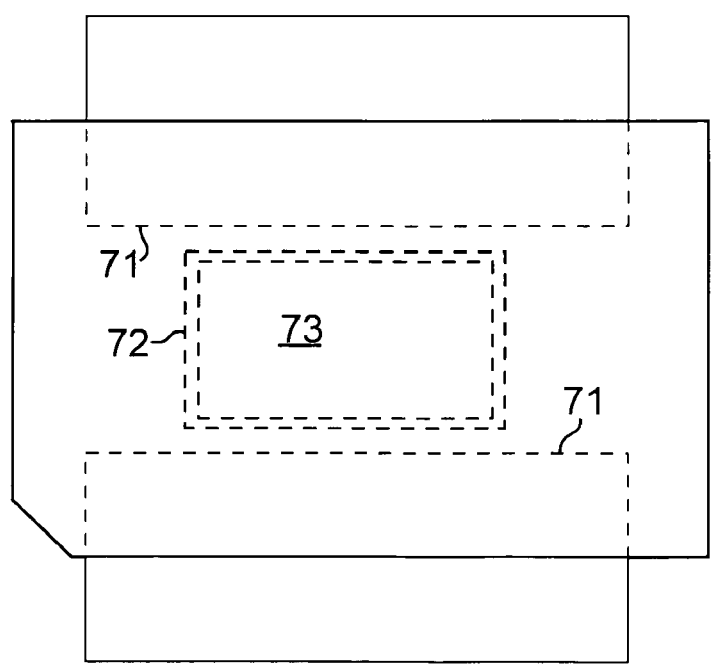
FIG. 7 is a plan view of the twin lead plastic overmolded package of FIG. 4 with a schematic showing of the internal portion of the lead frame.

FIGS. 1-6 illustrate the plastic overmolded package outline, i.e. the outside form of the package. The leads that extend from the package are typically part of a leadframe. In well-known fashion, the lead frame organizes the lead configuration that extends from the edges of the plastic overmolded package. It also provides a platform for the device or devices that are encapsulated inside the plastic overmold. This is illustrated in a schematic way in FIG. 7, where the portion of the leadframe that is housed within the plastic encapsulant is shown outlined in phantom at 71. The device, in this example a power diode, is shown at 73. The power diode is a typically a silicon chip that is electrically connected to the leads 71. Alternatives exist for mounting and connecting the chip 73. The leadframe may contain a center paddle 72 that supports the chip. The chip may then be connected to the leads with wire bonds or other suitable means. Alternatively, the chip may be bump bonded using solder bumps to each of the leads 71.

Merging the twenty leads of the plastic overmolded package of FIGS. 1 and 2 into two, or even six may affect the mechanical performance of the plastic overmolded package. A typical plastic overmolded package is molded in a molding operation that produces two plastic masses that are joined, while still uncured, to form the shape shown in FIG. 1 for example. This produces a seam, indicated at 14, where the two uncured plastic bodies join together. The seam occurs also between each of the leads 12, thus producing a molded structure with a finite integrity that is partly attributable to the multiple seams between the leads. It is intuitively easy to understand that the in the modified designs of FIGS. 3 and 5, much, or all, of the portion of the seam between the leads is eliminated. This may have implications for the mechanical integrity of the plastic overmolded package. In particular, the tendency of the leads to pull away from the plastic overmold is increased. This is due to at least two physical features. One, the tab-like design, and the mounting technique, are more likely to result in significant lateral forces on the leads. And two, merging many leads into several, or two, multiplies the lateral force per lead.

Figure 8:
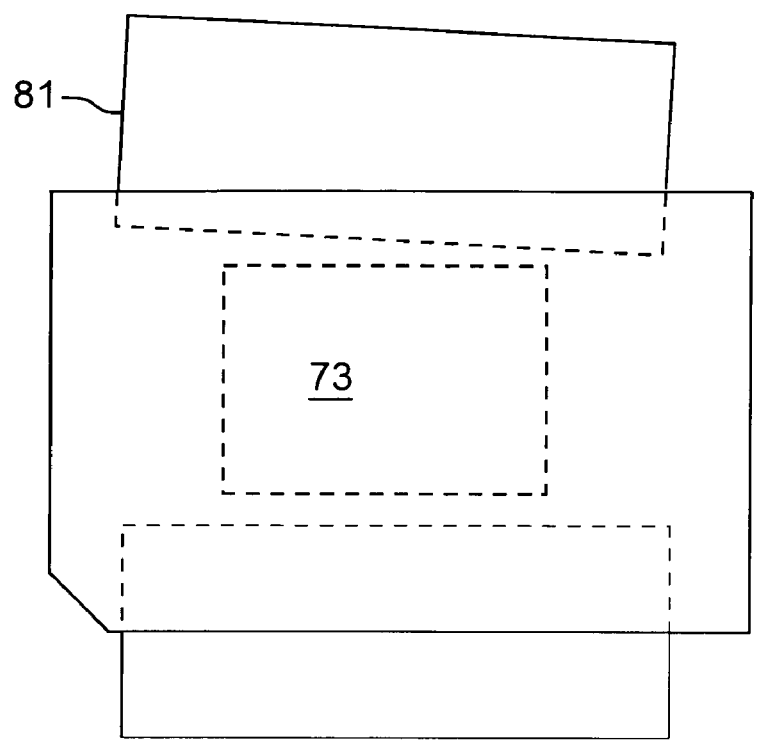
FIG. 8 is an illustration of the problem of mechanical distortion or separation of the leads in the twin lead plastic overmolded package.

The problem just outlined is illustrated in FIG. 8 where lead 81 is shown displaced from the intended position due to one or a combination of physical forces on the single lead. Obviously if the displacement is large enough to cause a separation from the device 73, that will cause an electrical failure. However, even smaller displacements, in fact relatively small strains, may fracture a solder bond, or damage a wire bond, and cause failure.

Figure 9:
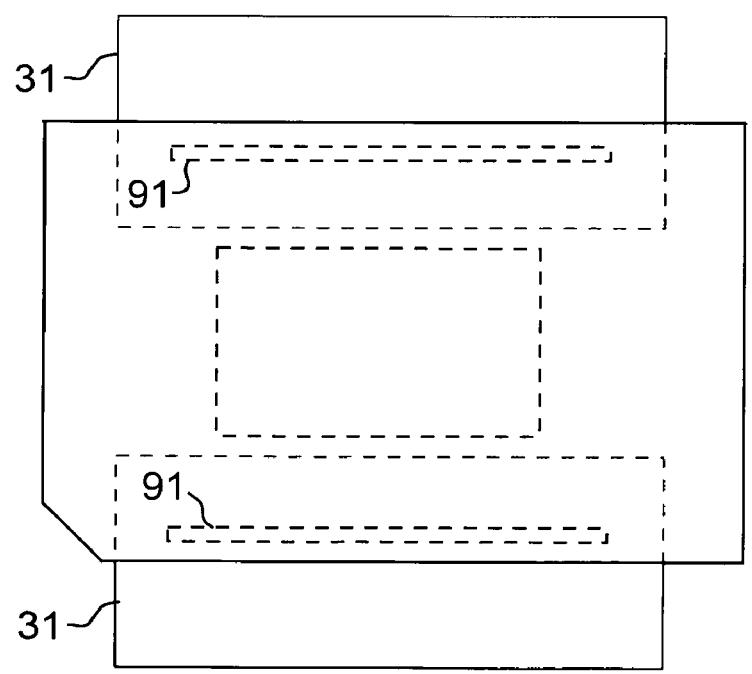
FIG. 9 is one embodiment of a plastic overmolded twin lead package where the leads are provided with retention slots according to the invention.

To increase the mechanical integrity of the plastic overmolded package we have modified the design of the leadframe. FIG. 9 shows one embodiment of the invention wherein slots 91 are provided through the leadframe prior to overmolding. This forms a trough through which the plastic flows. and joins from one side of the mold to the other. This restores the portions of the seam that was discussed earlier. The seam in this case is still absent from the outer or visible edge, but exists within the overmold.

Figure 10:
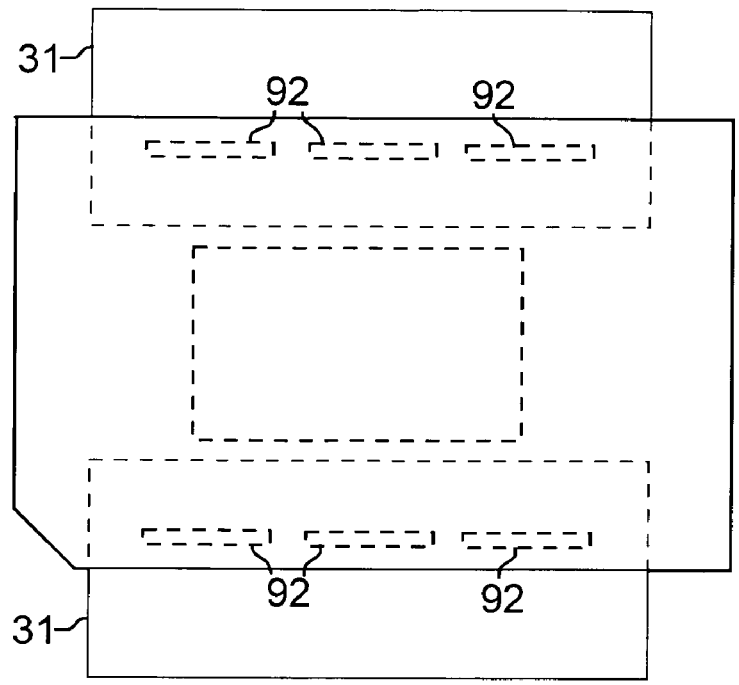
FIG. 10 shows a six lead embodiment according to the invention.

An alternative embodiment is shown in FIG. 10 where there are three slots 92 provided in each tab lead 31. It can be concluded that any number of slots may be used. Moreover, they may be side-by-side as shown in these figures, or formed in one or more rows. However, due to space considerations the side-by-side configuration will usually be preferred.

To more completely appreciate the mechanical consequences of the slots 91 in FIG. 9, or 92 in FIG. 10, a discussion of the nature of the retention forces on the twin leads 31 may be helpful. Although, as mentioned above, it is intuitively easy to understand that the retention force for lead 31 is improved in the design of FIG. 9, the actual force analysis is quite complex.

Figure 11:
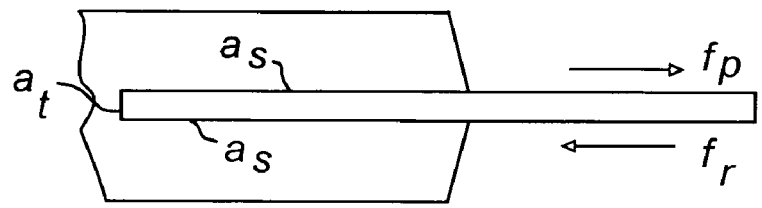
FIGS. 11-13 are diagrams showing dimensions relevant to the design of the retention slots of the invention.

Some of the relevant force considerations are represented in FIG. 11. It should be understood that there is no attempt here to present a rigorous force analysis but only to illustrate to first order some of the most relevant force aspects of the retention slots of the invention. In FIG. 11 the pull force on the lead is represented by the arrow $f_p$ and the retention forces by arrow $f_r$. In the tab lead structure of FIGS. 3 and 5, the main retaining forces for the tab lead shown are adhesive forces between the tab surface and the polymer surface. Force $a_t$ is along the inside end of the tab lead and is a polymer to metal adhesive force in tension. Force $a_s$ is along the side edges and the top and bottom of the tab lead and is a polymer to metal adhesive force in shear. In each case the force is a function of the area. The polymer to tab adhesive force in tension, $a_t$ is small compared with $a_s$. This is because polymer to metal adhesion in tension is less than in shear, and because the area for $a_t$ is small compared with the area for $a_s$. Thus the $f_r$ component attributable to $a_t$ may be disregarded, and force $f_r$ is approximated as equal to twice area of the tab in the horizontal plane x $a_s$.

Figure 12:
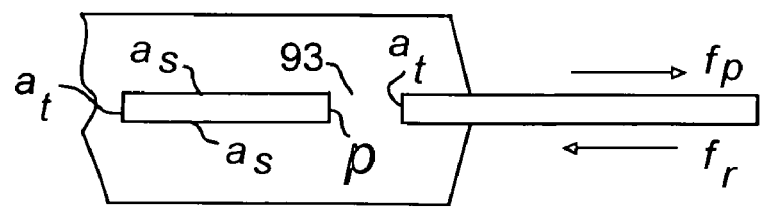
Figure 13:
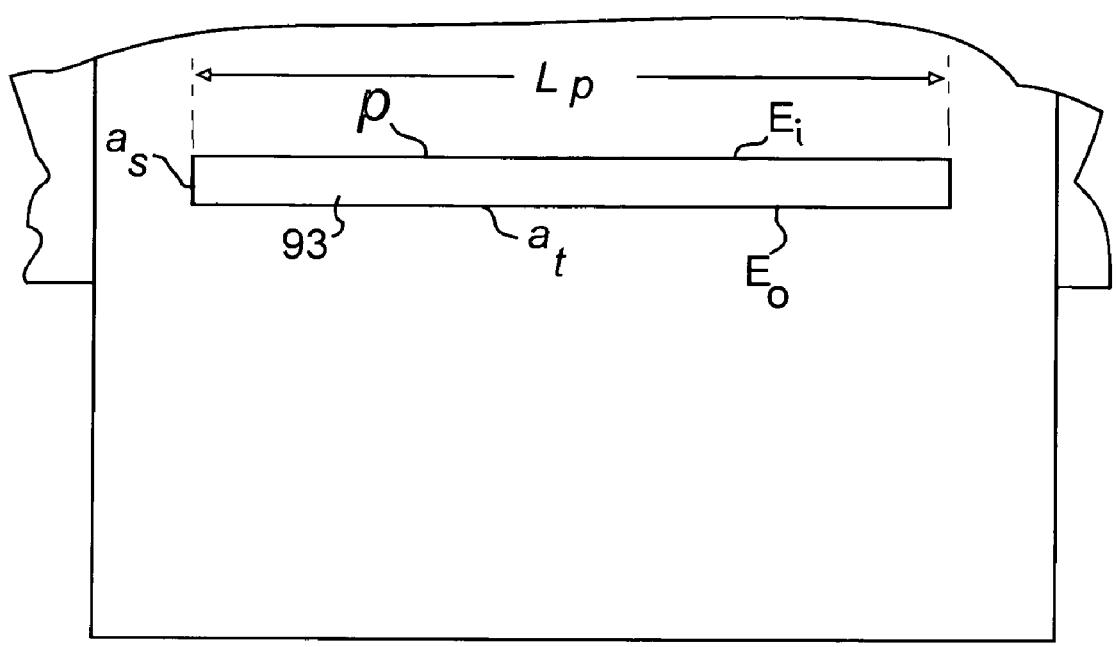

The corresponding force diagram with the slot configuration is shown in FIG. 12. The tab lead is shown with a slot at 93 where the plastic flows continuously through the slot from the top plastic mass to join the bottom plastic mass. Now the retention force picture changes drastically. The adhesive retention forces $a_t$ and $a_s$ are still present, although the area of the $a_s$ force is reduced by the area of the slot. Also at is essentially doubled, but still regarded as inconsequential. A new force is added, represented by p, which is a polymer fracture force for the polymer molding material. To polymer fracture force is very large compared with any of the adhesive forces. If an assumption is made that the polymer is relatively rigid, which is qualitatively the case for thermoset molding compounds, the force p is the polymer bond fracture force times the area of the edge of the slot indicated at p. FIG. 13 shows slot 93 in plan view. It is evident that the retention forces attributed to adhesion at the sides of the slot, indicated at $a_s$, and the edge designated $a_t$, are small. The main retention force is the retention force associated with the wall of the slot designated p, where the retention force equation is dominated by the polymer fracture force. This force is a direct function of length $L_p$.

From the brief analysis above, it is evident that the portion of the slot indicated at $a_t$ is relatively inconsequential. This means, inter alia, that the width of the slot is immaterial as long as it is wide enough for the polymer to flow through from each side and join. The ability of the polymer to flow through the slot is also a function of the aspect ratio of the slot. It is recommended that the aspect ratio be at least 1 to ensure flow through. Stated otherwise, the width of the slot should be at least equal to the thickness of the tab lead. The maximum width of the slot, as just stated, is inconsequential, and can be as wide as desired without limitation. (A caution, the slot width should not be confused with the lead width. They are not along the same axis.) Since the edge of the slot that is outboard with respect to the plastic overmolded package (indicated at $E_o$ in FIG. 13) provides little retaining force, it is not important, from the standpoint of meeting the goals of the invention, for the outboard side to lie within the plastic overmold. The inboard edge, $E_i$ in FIG. 13, is desirably maximixed in $L_p$.

A similar analysis can be done with the embodiment of FIG. 5. In this design, dimension $L_p$, the dominant determinant of $f_r$ is somewhat reduced. However, it is still significant overall. In terms of meeting the goals of the invention, it is considered adequate if the integrated length $L_p$ (the sum of the slot lengths in FIG. 5) is greater than 30% of the total width of the lead. In the usual case this prescription is:

$$L_p > 0.3[(N \times w) + (N-1)s]$$

where $L_p$ is the sum of the slot lengths on a side of the plastic overmolded package, N is the number of leads on a side, w is the width of the leads, and s is the linear separation between the leads. As mentioned above, in the preferred case N=1-3.

The foregoing analysis shows that by far the most effective feature for a retaining tab lead against the pull forces described is an opening in the tab that has a maximum wall length normal to the direction of the pull force. From this it can be deduced that a round opening is less effective. The force retention performance of the edge of a round hole transitions from pure $a_s$ to p. Moreover, the space on the leadframe, and the space internal of the package, that may be devoted to a retention feature is limited. That space is usually rectangular with a large aspect ratio, i.e. large ratio of length $L_s$ to width $W_s$. This follows from the usual circumstance that the chip occupies most of the area of the plastic overmolded package. Typically there is a space along the edges of the chip where retention features may be placed, but that space is limited. A slot with an essentially straight inboard edge is an efficient structure in terms of maximizing $L_p$.

The analysis set forth above assumes a lateral pull force. Other forces are encountered in the use environment that also degrade the mechanical and electrical performance of the plastic overmolded package. For example, twisting of the leads is common. From a qualitative perspective, the retention slots of the invention are useful for improving the overall mechanical integrity of the plastic overmolded package, and mitigate against most types of mechanical strains and deformations that the device will see in use.

As mentioned above, the embodiments shown are examples of plastic overmolded packages with leads extending from the edges of the plastic overmold. The packages generally have a quadrilateral shape. The leadframes within the plastic overmold typically have a center die attachment region where the die is bonded, and leads extending from two opposing sides. The invention may also be applied to a quad pack design where leads extend from four sides.

A slot by definition has an aspect ratio of length to width greater than 1, usually significantly greater than 1. The edges along the length, i.e. the longest edges are referred to below as the major edges. In the device structures shown here one of the major edges is closest to the center of the plastic overmolded package, and is referred to below as the inboard major edge. The other edge, furthest from center of the package, is referred to as the outboard edge. The edges of the slot are typically essentially straight. However, it is recognized that the outboard major edge is relatively incidental to the goals of the invention and thus may assume any reasonable shape. Moreover, the aspect ratio of the slot assumes less importance due to the minimal consequences of the outboard edge.

Various additional modifications of this invention will occur to those skilled in the art. All deviations from the specific teachings of this specification that basically rely on the principles and their equivalents through which the art has been advanced are properly considered within the scope of the invention as described and claimed.

The invention claimed is:

1. A plastic overmolded package comprising:
   a. a leadframe, the leadframe having a top side and a bottom side, and comprising:
      i. a die attachment portion on the top side of the leadframe,
      ii. at least one semiconductor device attached to the die attachment portion on the top side of the leadframe, with the bottom side of the leadframe devoid of a semiconductor device,
      iii. at least two leads extending from the center die attachment portion, the leads having a width $W_{lead}$ and a thickness T,
      iv. at least one slot formed in at least one of the leads, the at least one slot having a width $W_{slot}$ and a length L, wherein length L is substantially greater than width $W_{slot}$, and wherein the length L of the slot extends along the width $W_{lead}$ of the lead, and further wherein the at least one slot extends through the thickness T of the lead thus providing an inboard slot edge nearest to a semiconductor device and an outboard slot edge furthest from the device,
   b. a plastic overmold comprising an integral body having a top, a bottom and sidewalls, the plastic overmold filling the at least one slot and additionally encapsulating the semiconductor device and the bottom of the leadframe while leaving a portion of the leads exposed, the exposed portions of the leads extending away from the sidewalls of the overmold.

2. The package of claim 1 wherein the inboard slot edge is essentially a straight edge.

3. The package of claim 1 wherein the leadframe has exactly two leads.

4. The package of claim 1 wherein the leadframe comprises no more than six leads.

5. The package of claim 1 wherein the inboard slot edge has length $L_p$ and $L_p$ is greater than $0.3 \times W_{lead}$.

6. The package of claim 1 wherein $W_{slot}/T$ is at least 1.

7. The package of claim 1 wherein the leadframe comprises N>1 leads on one side of the plastic overmolded package, the leads separated by distance s, wherein:

$$L_p > 0.3[(N \times W_{lead}) + (N-1)s]$$

where $L_p$ is the sum of the inboard slot edges on the one side of the plastic overmolded package, and $W_{lead}$ is the width of the leads.

8. The package of claim 1, wherein:
   a plurality of slots are formed in the at least one lead, each slot of the plurality of slots having a width $W_{slot}$ and a length L, wherein length L is substantially greater than width $W_{slot}$, and wherein the length L of the slot extends along the width $W_{lead}$ of the lead; and
   each slot of the plurality of slots extends through the thickness T of the lead thus providing an inboard slot edge nearest to a semiconductor device and an outboard slot edge further from the device.

9. The package of claim 8, wherein the plurality of slots line up end-to-end on the at least one lead.

10. The package of claim 8, wherein the plurality of slots are formed in rows.

* * * * *